United States Patent
Beatson et al.

(10) Patent No.: US 6,997,368 B2
(45) Date of Patent: *Feb. 14, 2006

(54) FIBER ALIGNMENT PROCESS USING CORNERCUBE OFFSET TOOL

(75) Inventors: David T. Beatson, Kennett Square, PA (US); Deepak Sood, New Britain, PA (US); Ashoke Banerjee, Willow Grove, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 406 days.

This patent is subject to a terminal disclaimer.

(21) Appl. No.: 10/458,535

(22) Filed: Jun. 10, 2003

(65) Prior Publication Data

US 2003/0209587 A1 Nov. 13, 2003

Related U.S. Application Data

(60) Division of application No. 10/131,873, filed on Apr. 25, 2002, now Pat. No. 6,729,530, which is a continuation-in-part of application No. 09/912,024, filed on Jul. 24, 2001, now Pat. No. 6,412,683.

(51) Int. Cl.
*B23K 31/02* (2006.01)

(52) U.S. Cl. ..................... 228/103; 228/102
(58) Field of Classification Search ............... 228/103; 385/52
See application file for complete search history.

(56) References Cited

U.S. PATENT DOCUMENTS

| | | |
|---|---|---|
| 3,072,011 A | 1/1963 | Hemstreet et al. |
| 3,485,547 A | 12/1969 | Bougon et al. |
| 3,601,490 A | 8/1971 | Erickson |
| 3,853,404 A | 12/1974 | Barrett |
| 3,865,467 A | 2/1975 | Von Thuna |
| 3,940,608 A | 2/1976 | Kissinger et al. |
| 3,999,854 A | 12/1976 | Barrett |
| 4,005,937 A | 2/1977 | Barrett |
| 4,325,638 A * | 4/1982 | Takeda et al. ............ 356/622 |
| 4,452,506 A * | 6/1984 | Reeve et al. ............. 385/52 |

(Continued)

*Primary Examiner*—Jonathan Johnson
(74) *Attorney, Agent, or Firm*—RatnerPrestia

(57) ABSTRACT

A system and method for aligning optical fibers that takes into account variations due to temperature changes and other nonrandom systemic effects. The system includes an alignment tool having a plurality of internal reflection surfaces and located below a vision plane of the first one of the pair of optical fibers, and an optical detector to receive an indirect image of a bottom surface of the first optical fiber through the alignment tool, such an offset between the first optical fiber and the optical detector is determined based on the indirect image received by the optical detector. The method comprises the steps of providing a cornercube offset tool having a plurality of total internal reflection surfaces below a vision plane of the first optical fiber, and receiving an indirect image of the first optical fiber through the cornercube offset tool.

15 Claims, 19 Drawing Sheets

U.S. PATENT DOCUMENTS

| | | | |
|---|---|---|---|
| 5,177,348 A * | 1/1993 | Laor | 250/201.1 |
| 5,566,877 A | 10/1996 | McCormack | |
| 5,581,632 A | 12/1996 | Koljonen et al. | |
| 5,640,199 A | 6/1997 | Garakani et al. | |
| 5,702,049 A | 12/1997 | Biggs et al. | |
| 5,760,905 A * | 6/1998 | Sasagawa | 356/614 |
| 5,861,909 A | 1/1999 | Garakani et al. | |
| 5,991,436 A | 11/1999 | Koljonen et al. | |
| 6,097,858 A * | 8/2000 | Laor | 385/16 |
| 6,118,540 A | 9/2000 | Roy et al. | |
| 6,341,014 B1 | 1/2002 | Maurel et al. | |
| 6,470,114 B1 * | 10/2002 | Kloth | 385/31 |
| 6,556,285 B1 * | 4/2003 | Dickson | 356/121 |

\* cited by examiner

FIBER ALIGNMENT PROCESS USING CORNERCUBE OFFSET TOOL

This application is a divisional application of U.S. patent application Ser. No. 10/131,873, filed Apr. 25, 2002, now U.S. Pat. No. 6,729,530 which is a continuation-in-part of U.S. patent application Ser. No. 09/912,024, filed Jul. 24, 2001, now U.S. Pat. No. 6,412,683, issued Jul. 2, 2002.

FIELD OF THE INVENTION

This invention relates generally to the use of machine vision systems for semiconductor chip bonding/attaching devices. More specifically, the present invention relates to the use of a corner cube retro-reflector as an offset alignment tool that acquires indirect images of optical fibers optic during the alignment process when the same lie outside the view of the imaging system. From such images, coordinate information on position can be obtained and any positional offset from reference position of the fiber optic alignment tool due to deviations caused by thermal change or other nonrandom systemic errors can be taken into account for correct alignment and placement of optical fibers with respect to other optical fibers or fiber optic detectors/devices/elements.

BACKGROUND OF THE INVENTION

The fabrication of electronic assemblies, such as integrated circuit chips and fiber optic cables, requires alignment inspection of the device at various phases of the fabrication process. Such alignment inspection procedures utilize vision systems or image processing systems (systems that capture images, digitize them and use a computer to perform image analysis) to align devices and guide the fabrication machine for correct placement and/or alignment of components.

In conventional systems, post attach inspection is used to determine if changes in fabrication machine position are necessary to effect proper placement and/or alignment. As such, these conventional systems can only compensate for misalignment after such improper alignment is made, thereby negatively effecting yield and throughput. These conventional systems have additional drawbacks in that they are unable to easily compensate for variations in the system due to thermal changes, for example, requiring periodic checking of completed devices further impacting device yield and negatively impacting manufacturing time.

In conventional systems the vision system (shown in FIG. 11) consists of two image devices, a first image device 1104 placed below the optical plane 1112 and views objects upward and a second image device 1102 placed above the optical plane and views objects downward. These conventional systems have drawbacks, in that in addition to requiring more than one image device, they are unable to easily compensate for variations in the system due to thermal changes, for example.

SUMMARY OF THE INVENTION

In view of the shortcomings of the prior art, it is an object of the present invention to provide a system and method for aligning optical fibers using a vision system that takes into account variations due to temperature changes and other nonrandom systemic effects.

The present invention is a vision system for use in aligning optical fibers. The system comprises an alignment tool having a plurality of internal reflection surfaces, the alignment tool located below a vision plane of the first optical fiber; and an optical detector to receive an indirect image of a bottom surface of the first optical fiber through the alignment tool.

According to another aspect of the invention, the vertex of the alignment tool is located at a position about midway between the optical axis of the optical detector and the optical axis of the first optical fiber.

According to a further aspect of the invention, the alignment tool comprises a cornercube offset tool.

According to still another aspect of the invention, the focal plane of the vision system is positioned at or above the alignment tool.

According to yet another aspect of the present invention, the system includes a lens positioned between the alignment tool and i) the optical detector and ii) the first optical fiber.

According to still another aspect of the present invention, the system includes a first lens positioned between the optical detector and the alignment tool and a second lens positioned between the first optical fiber and the alignment tool.

According to a further aspect of the present invention, the first lens and the second lens are located at or below the image plane.

According to yet a further aspect of the present invention, the reflecting surfaces are three mutually perpendicular faces.

According to yet another aspect of the present invention, the angle between each of the internal reflective surfaces and the top surface of the cornercube offset tool is about 45°.

According to still another aspect of the invention, the optical detector is a CCD camera.

According to yet another aspect of the invention, the optical detector is a CMOS imager.

According to yet a further aspect of the invention, the optical detector is a position sensitive detector.

According to an exemplary method of the present invention, a cornercube offset tool is positioned below a vision plane of the first optical fiber; a lens is positioned between i) the first optical fiber and the cornercube offset tool and ii) between the optical imager and the cornercube offset tool; and the first optical fiber is viewed indirectly through the cornercube offset tool and the lens.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

Figure 1:
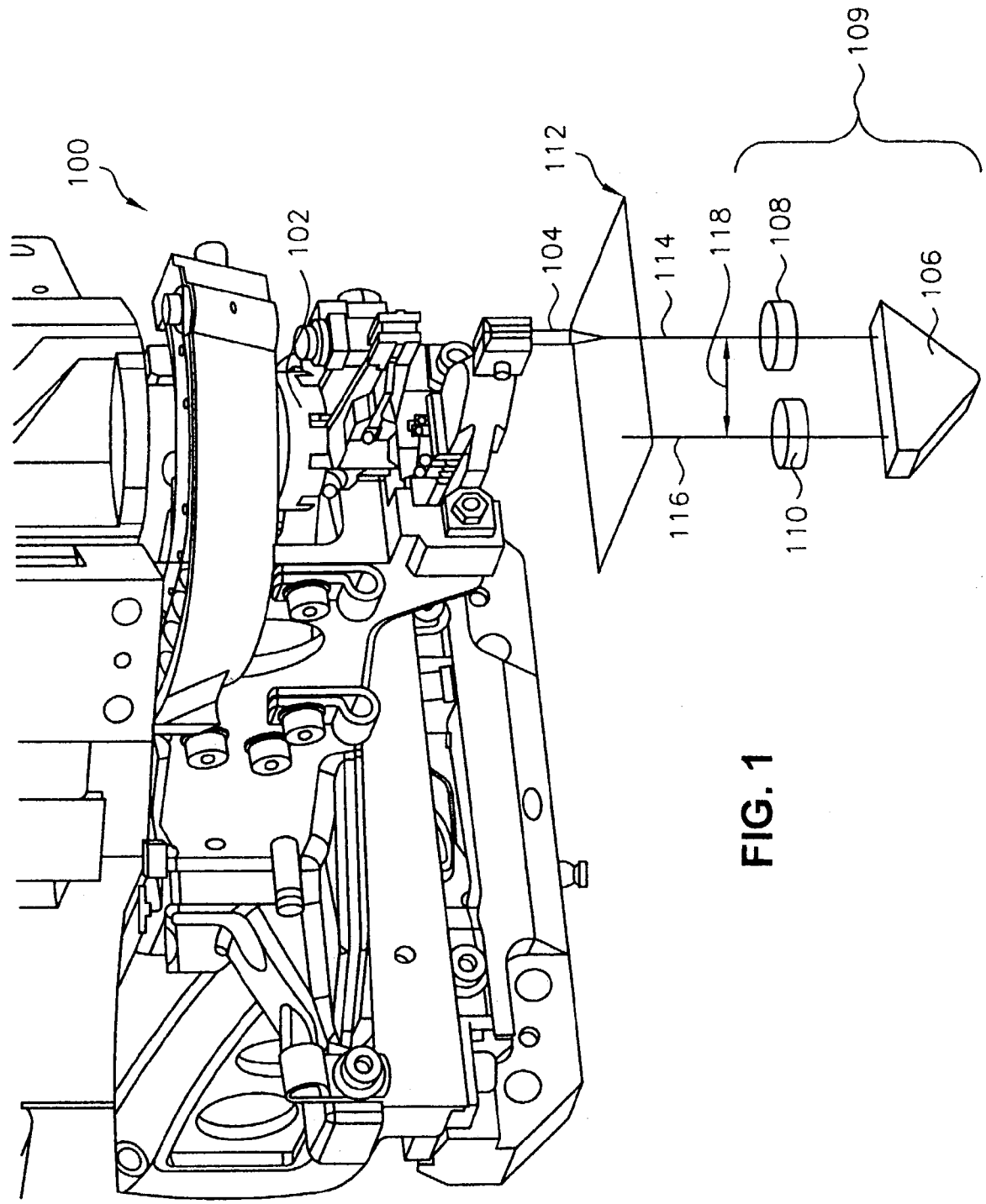
FIG. 1 is a perspective view of an exemplary embodiment of the present invention.

The entire disclosure of U.S. patent application Ser. No. 09/912,024 filed on Jul. 24, 2001 is expressly incorporated by reference herein Referring to FIG. 1 a perspective view of an exemplary embodiment of the present invention is shown. The system is included in wire bonding machine 100, and employs a cornercube 106, having a plurality of internal reflection surfaces (best shown in FIG. 6), located at or below image plane 112 of bonding tool 104.

In an exemplary embodiment, cornercube offset alignment tool 109 (comprising cornercube 106 and lens elements 108, 110), has a total of three internal reflection surfaces, 218, 220, and 221 (best shown in FIG. 6 and described below). In another exemplary embodiment, cornercube 106 may have a plurality of total internal reflective surfaces. In one exemplary embodiment, cornercube 106 is formed from fused silica, sapphire, diamond, calcium fluoride or other optical glass. Note, optical quality glass, such as BK7 made by Schott Glass Technologies of Duryea, Pa., may also be used. Note also that materials for cornercube 106 can be selected for maximum transmission with respect to the desired operating wavelength.

Optical imaging unit 102, such as a CCD imager, CMOS imager or a camera, for example, is mounted above image plane 112 in order to receive an indirect image of bonding tool 104 through cornercube offset alignment tool 109. In another exemplary embodiment, a position sensitive detector (PSD), such as that manufactured by Ionwerks Inc., of Houston, Tex., may also be used as optical imaging unit 102. In such an embodiment, when the hole in bonding tool 104 is illuminated, such as by using an optical fiber for example, the PSD can be utilized to record the position of the spot of light exiting bonding tool 104. It is also contemplated that the PSD may be quad cell or bi-cell detector, as desired.

In the exemplary embodiment, the focal point of the vision system (coincident with imaginary plane 211 shown in FIG. 2A) is located above bottom surface 223 (shown in FIG. 2A) of cornercube 106. In addition, the exemplary embodiment includes two preferably identical lens elements 108, 110 located at or below image plane 112. Another embodiment, shown in FIG. 2B, includes a single lens element 205 located below image plane 112 and in line with optical axes 114, 116. Hereinafter, the combination of cornercube offset tool 106, and lens elements 108, 110 (or lens element 205) will be referred to as assembly 109.

Image plane 112 of cornercube 106, including lens elements 108, 110, is positioned at the object plane of optical imaging unit 102. In other words, the object plane of cornercube 106 and lens elements 108, 110 are aligned to bonding tool 104 which also lies in image plane 112. In the exemplary embodiment, lens elements 108, 110 (or 205) preferably have a unitary magnification factor. First lens element 108 is positioned in a first optical axis 114 between bonding tool 104 and cornercube 106. Second lens element 110 is substantially in the same plane as that of first lens element 108 and is positioned in a second optical axis 116 between optical imaging unit 102 and cornercube 106. In one exemplary embodiment, first and second optical axes 114 and 116 are substantially parallel to one another, and are spaced apart from on another based on specific design considerations of bonding machine 100. In one exemplary embodiment the distance 118 between first optical axis 114 and second optical axis 116 is about 0.400 in. (10.160 mm.) although distance 118 may be as small as about 0.100 in. (2.54 mm) depending on design considerations related to the bonding machine.

Figure 2A:
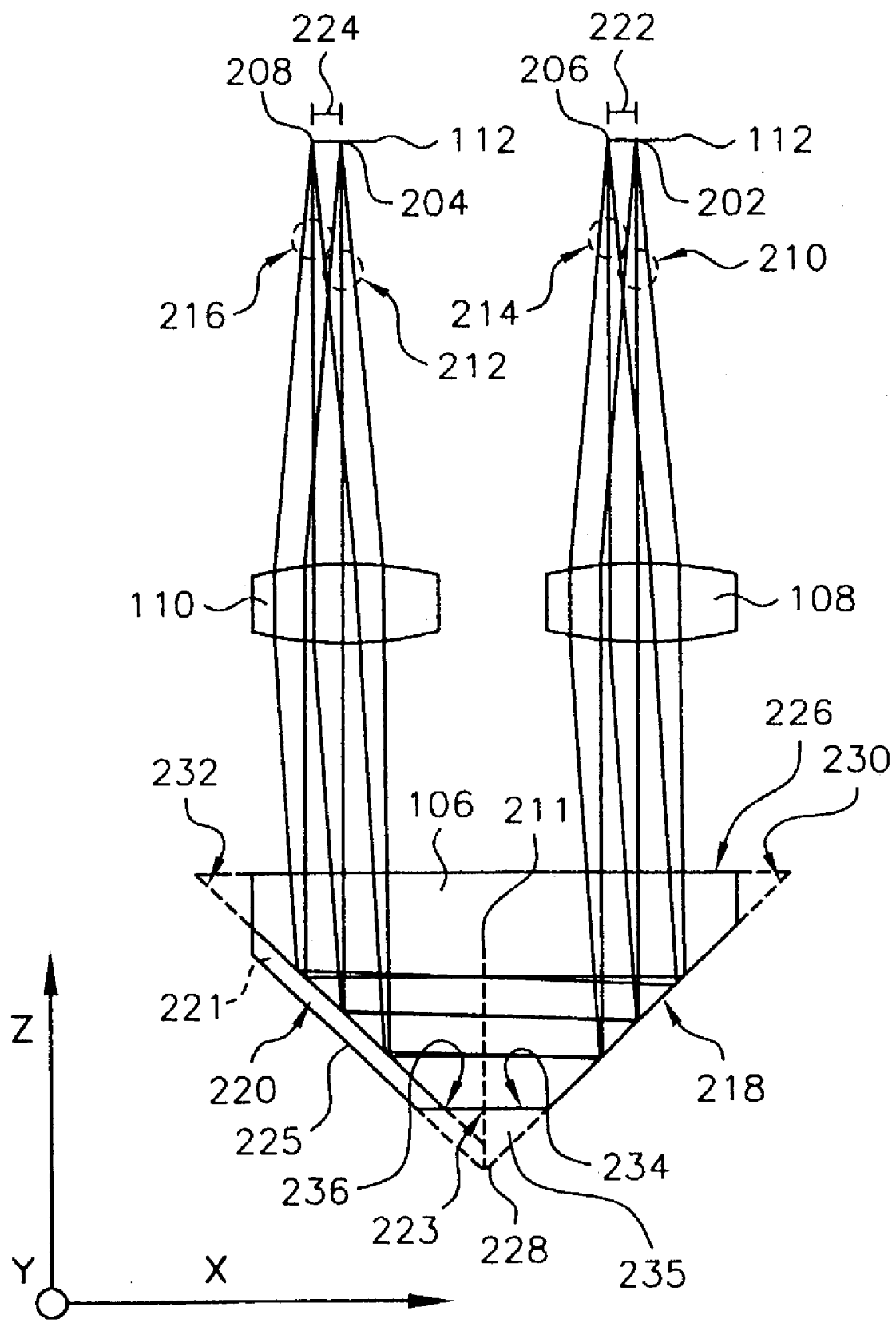
FIG. 2A is a side view of image ray traces according to a first exemplary embodiment of the present invention.
Figure 2B:
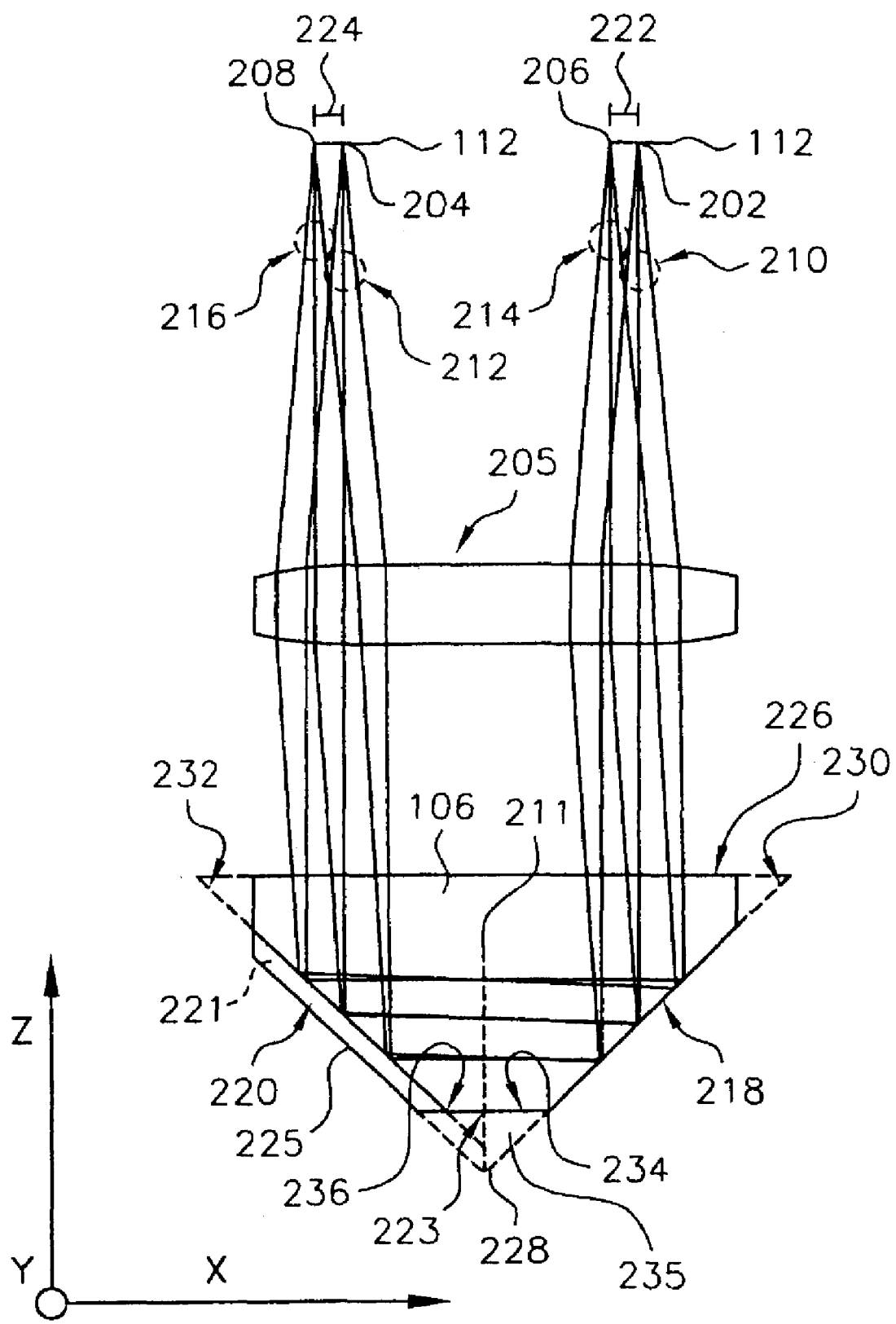
FIG. 2B is a side view of image ray traces according to a second exemplary embodiment of the present invention.

FIG. 2A is a detailed side view of image ray traces and illustrates the general imaging concept of an exemplary embodiment of the present invention. In FIG. 2A, exemplary ray traces 210, 214 are separated for clarity to illustrate the relative immunity of the resultant image due to positional changes. The same distance also separates the image points because lens elements 108, 110 serve as unitary magnification relays. FIG. 2A also demonstrates how changes in the bonding tool 104 position are compensated for. For example, once conventional methods have been used to accurately measure the distance between imaging unit 102 and bonding tool 104 (shown in FIG. 1), the present invention is able to compensate for changes in the bonding tool 104 offset position 222 due to changes in the system. The location of bonding tool 104 can be accurately measured because cornercube offset tool 106 images bonding tool 104 onto image plane 112 of the optical system.

The reference position of bonding tool 104 is shown as a reflected ray which travels from first position 202 along first optical axis 114 (shown in FIG. 1), as direct image ray bundle 210 from first position 202 through first lens element 108. Direct image ray bundle 210 continues along first optical axis 114 where it then passes through top surface 226 of cornercube 106 onto first internal reflection surface 218. Direct image ray bundle 210 is then reflected onto second internal reflection surface 220, which in turn directs it onto third internal reflective surface 221 (best shown in FIG. 3). Next, direct image ray bundle 210 travels back through top surface 226 of cornercube 106 as reflected image ray bundle 212 along the second optical axis 116 (shown in FIG. 1) and through second lens element 110 to image plane 112. It is reflected image ray bundle 212 that is detected by imaging unit 102 as image 204.

Consider now that the position of bonding tool 104 is displaced by a distance 222 due to a variation in system temperature, for example. As shown in FIG. 2A, the displaced image of bonding tool 104 is shown as position 206 and imaged along the path of second position ray trace 214. As shown in FIG. 2A, direct image ray bundle 214 travels along a path similar to that of direct image ray bundle 210 from first position 202. Second position 206 image travels as a direct image ray bundle 214, through first lens element 108. Direct image ray bundle 214 then passes through top surface 226 of cornercube 106 onto first internal reflection surface 218. Direct image ray bundle 214 is then reflected onto second internal reflection surface 220, which in turn directs it onto third internal reflection surface 221 (best shown in FIG. 3). Next, direct image ray bundle 214 travels through top surface 226 of cornercube 106 as reflected image ray bundle 216 and through second lens element 110 to image plane 112. Reflected image ray bundle 216 is viewed as a reflected image by imaging unit 102 as being in second position 208. Although the above example was described based on positional changes along the X axis, it is equally applicable to changes along the Y axis.

As illustrated, the original displacement of bonding tool 104, shown as offset position 222, is evidenced by the difference 224 in the measured location of bonding tool 104 at second position 208 with respect to reference location 204. As evidenced by the above illustration, a positional shift in assembly 109 does not affect the reflected image as viewed by imaging unit 102. In other words, assembly 109 of the present invention may be translated along one or both the X and Y axes such that the image of the bonding tool 104 appears relatively stationary to imaging unit 102. There will be some minimal degree of error, however, in the measured position of bonding tool 104 due to distortion in the lens system (discussed in detail below).

Referring again to FIG. 2A, vertex 228 (shown in phantom) of cornercube offset alignment tool 109 is located at a position approximately midway between first optical axis 114 and second optical axis 116. To facilitate mounting of cornercube 106, a lower portion 235 of the cornercube may be removed providing bottom surface 223, which may be substantially parallel to top surface 226. Removal of lower portion 235 does not affect the reflection of image rays since the image rays emanating from image plane 112 do not impinge upon bottom surface 223.

Exemplary cornercube 106 comprises top surface 226, first reflective surface 218, bottom surface 223, second reflective surface 220, and third reflective surface 221. If top surface 226 is set such that optical axes 114, 116 are normal to top surface 226, first reflective surface 218 will have a first angle 230 of about 45° relative to top surface 226, and a second angle 234 of about 135° relative to bottom surface 223. Likewise, ridgeline 225 (formed by the intersection of second and third reflective surfaces 220 and 221) has similar angles 232 and 236 relative to top surface 226 and bottom surface 223, respectively. In addition, second and third reflective surfaces 220 and 221 are orthogonal to one another along ridgeline 225. In the exemplary embodiment, bottom surface 223 of cornercube 106 may be used as a mounting surface if desired. It should be noted, however, that it is not necessary to form top surface 226 so that the image and reflected rays are normal thereto. As such, the corner cube will redirect the incident light or transmit image of bonding tool 104 parallel to itself with an offset equal to 118.

The present invention can be used with light in the visible, UV and IR spectrum, and preferably with light having a wavelength that exhibits total internal reflection based on the material from which cornercube 106 is fabricated. The material selected to fabricate cornercube offset alignment tool 109 is based on the desired wavelength of light which the tool will pass. It is contemplated that cornercube offset alignment tool 109 may be fabricated to handle a predetermined range of light wavelengths between the UV (1 nm) to the near IR (3000 nm). In a preferred embodiment, the range of wavelength of light may be selected from between about i) 1 and 400 nm, ii) 630 and 690 nm, and iii) 750 and 3000 nm. Illumination may also be provided by ambient light or by the use of an artificial light source (not shown). In one exemplary embodiment, typical optical glass, having an index of refraction of 1.5 to 1.7, may be used to fabricate cornercube 106. Note, the index of refraction is based upon the material chosen for maximum transmission at the desired operating wavelength. In one embodiment, cornercube offset alignment tool 109 has an index of refraction of about 1.517.

Figure 3:
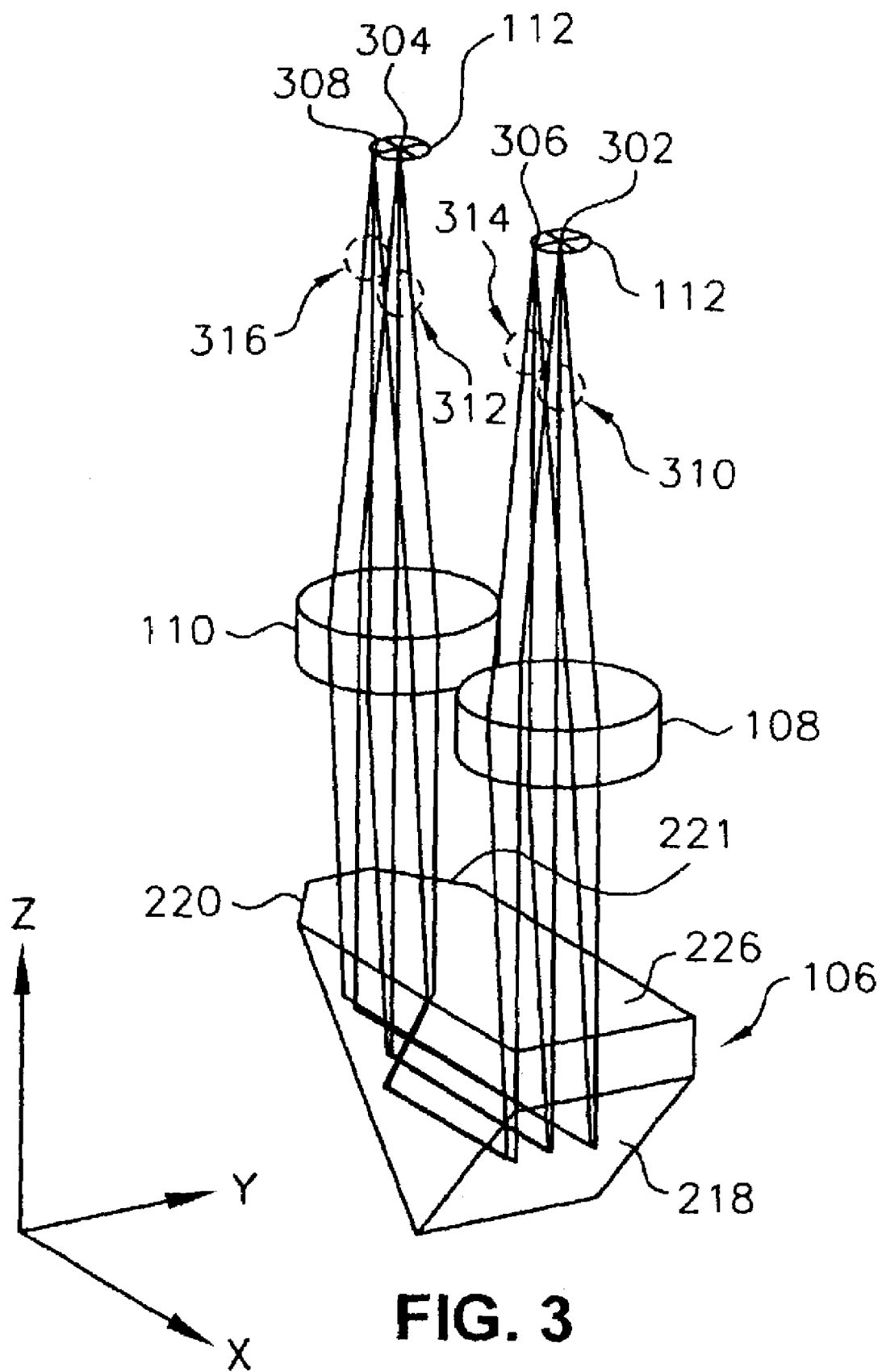
FIG. 3 is a perspective view of image ray traces according to an exemplary embodiment of the present invention.

FIG. 3 is a perspective view of image ray traces according to an exemplary embodiment of the present invention translated in a direction perpendicular to the separation of lens elements 108, 110. The same image properties shown in FIG. 2A are also evident in FIG. 3. For example, the reference position of bonding tool 104 is represented by first position 302 and its image 304 is viewed as a first direct image ray 310 which travels along first optical axis 114 through first lens element 108; passes through top surface 226 of cornercube 106; strikes first reflective surface 218 of cornercube 106; travels through cornercube 106 in a path parallel to top surface 226; strikes second reflective surface 220; strikes third reflective surface 221 before exiting the cornercube 106 through top surface 226 and travels along second optical axis 116 through second lens element 110 onto image plane 112 and viewed by imaging unit 102 at position 304. Positional displacement of bonding tool 104 is also shown in FIG. 3 and is illustrated by the path of the ray traces 314, 316 from second position 306 to second viewed position 308.

Figure 4A:
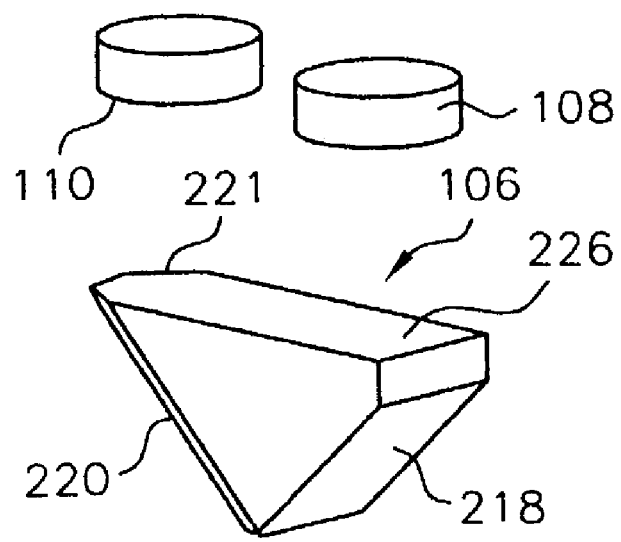
FIGS. 4A and 4B are perspective and side views, respectively, of an exemplary embodiment of the present invention.
Figure 4B:
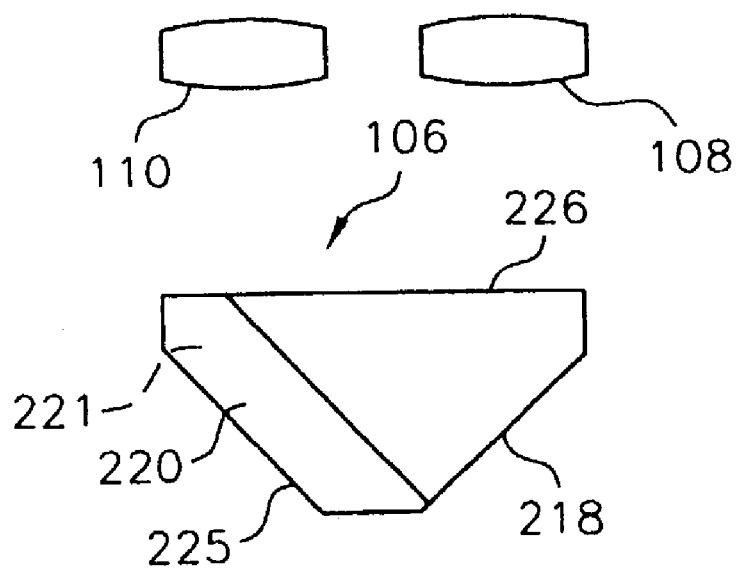

FIGS. 4A–4B are perspective and side views, respectively, of an exemplary embodiment of the present invention illustrating lens elements 108, 110 and cornercube 106. The two lens elements 108, 110 (or 205) are preferably doublets located above the cornercube 106 based on their focal distance from image plane 112 and imaginary plane 211. Doublets are preferred based on their superior optical qualities. As illustrated in FIGS. 4A–4B, an exemplary embodiment of cornercube 106 has three internal reflective surfaces, 218, 220 and 221. As shown in FIG. 4B, the exterior edges of lens elements 108, 110 and cornercube 106 are coincident with one another.

Figure 5:
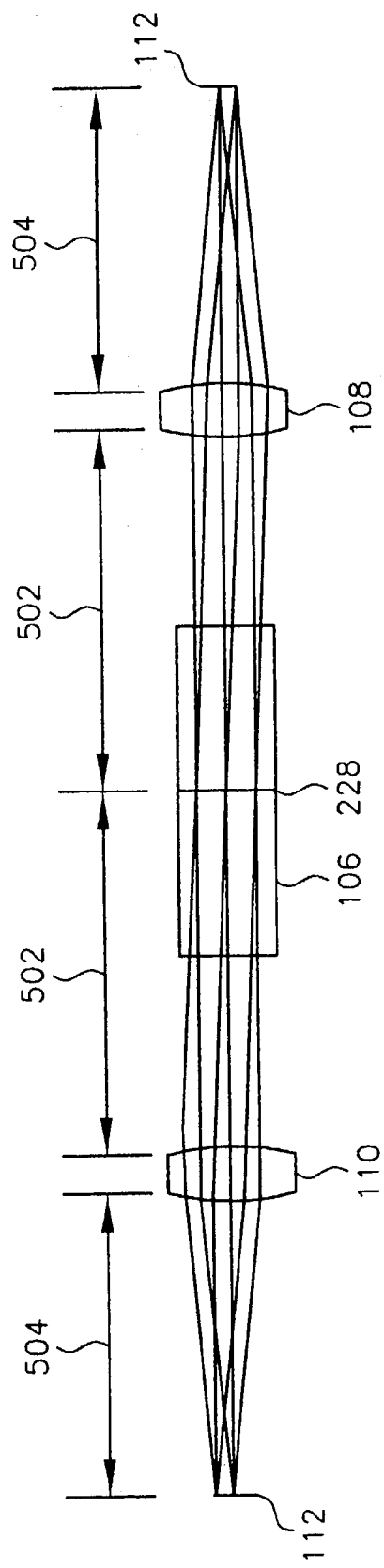
FIG. 5 illustrates the telecentricity of an exemplary embodiment of the present invention.

FIG. 5 illustrates the telecentricity of an exemplary embodiment of the image system of the present invention. As shown in FIG. 5, lens elements 108, 110 produce a unitary magnification and are arranged relative to cornercube 106 such that the telecentricity of the machine vision system is maintained. Note that front focal length 502 from lens element 108 to vertex 228 of cornercube 106 is equal to front focal 502 from lens element 110 to vertex 228 of cornercube 106. Note also, that back focal length 504 from lens element 108 to image plane 112 is equal to back focal length 504 from lens element 110 to image plane 112.

Figure 6:
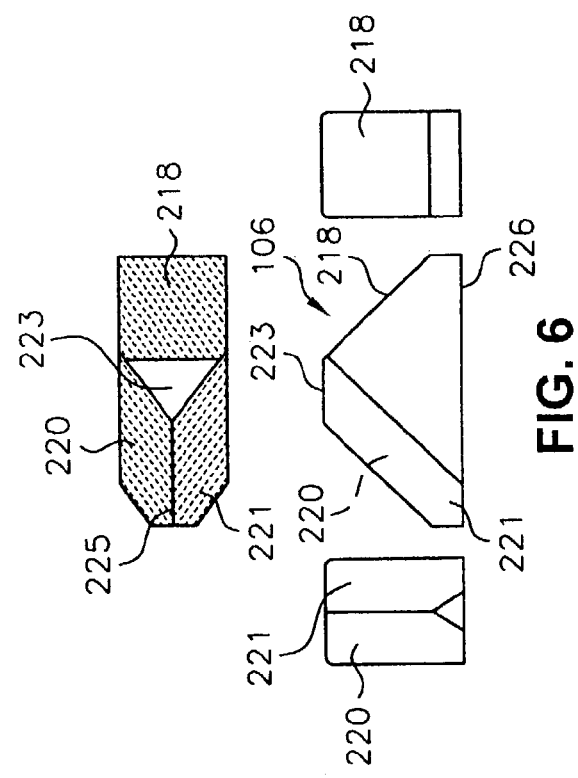
FIG. 6 is a detailed view of an exemplary retroreflective cornercube offset tool according to the present invention.

FIG. 6 is a detailed view of an exemplary cornercube 106 of the present invention. Note that internal reflection surface, 218 and ridgeline 225 allow an image of bonding tool 104 to be translated in the X and Y directions. Note also, that the surfaces of cornercube 106 are preferably ground so that a reflected beam is parallel to the incident beam to within 5 arc seconds.

As shown in FIG. 6, surfaces 220 and 221 are orthogonal to one another along ridgeline 225. In addition, the angle between ridgeline 225 and surface 218 is about 90°. Furthermore, surface 218 and ridgeline form an angle of 45° relative to top surface 226 and bottom surface 223. Note also, that surfaces, 218, 220, and 221 meet to form triangular shaped bottom surface 223, which may be used to facilitate mounting of cornercube 106.

Figure 7A:
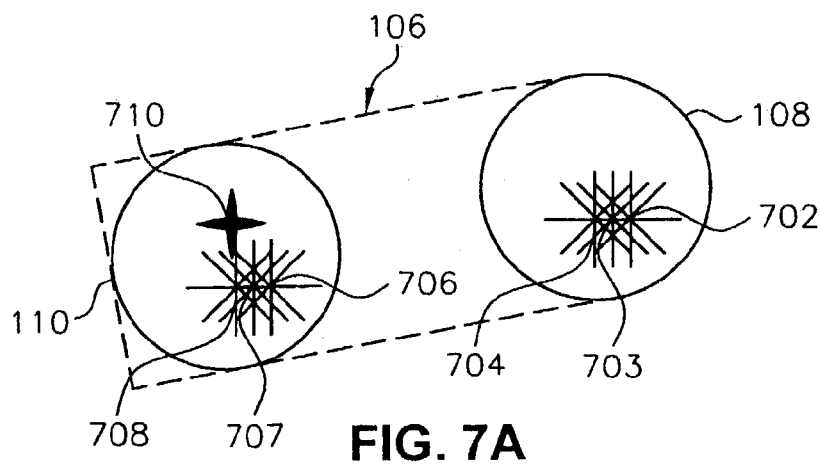
FIGS. 7A–7C illustrate the effect of tilt about the vertex of the cornercube tool of the exemplary vision system.
Figure 7B:
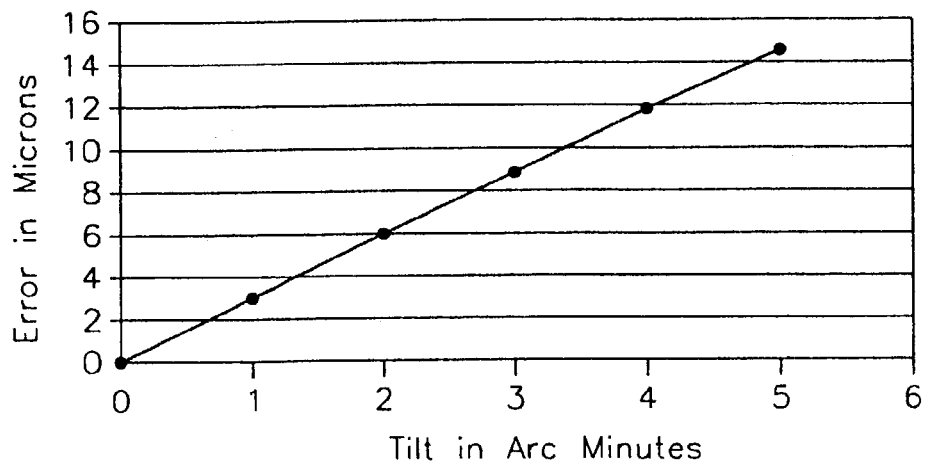
Figure 7C:
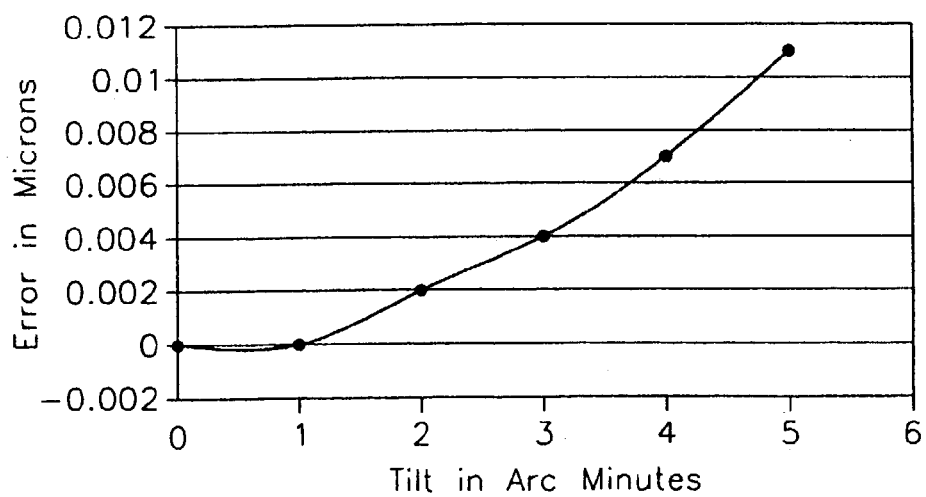

FIGS. 7A–7C illustrate the effect of tilt about the orthogonal of cornercube offset alignment tool 109 in an exemplary vision system. FIG. 7A is an overhead view of lens elements 108, 110 and cornercube 106. Exemplary image origins, 702, 704, 706, and 708 correspond to the position of image ray traces 210, 214 (shown in FIG. 2A). Note that optic axis position 710 corresponds to the position where the image of bonding tool 104 (shown in FIG. 1) would be if cornercube 106 was not tilted along the Z axis.

FIGS. 7B–7C are graphs of the effect of tilt around the Z axis in terms of tilt in arc minutes vs. error in microns. FIG. 7B shows the effect of tilt around the Z axis versus error and image location along the Y axis. FIG. 7C shows the effect of tilt around the Z axis versus error and image location along the X axis.

Figure 8B:
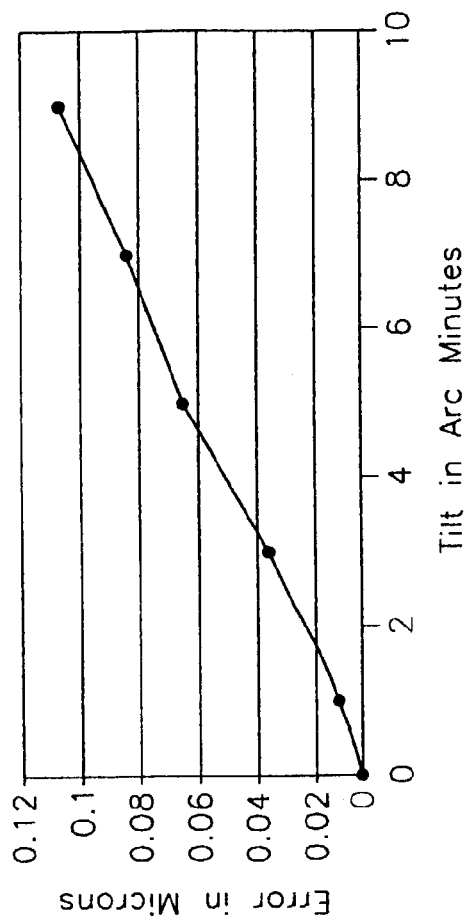
FIGS. 8A–8C illustrate the effect of tilt about the X and Y axis of the exemplary vision system.
Figure 8C:
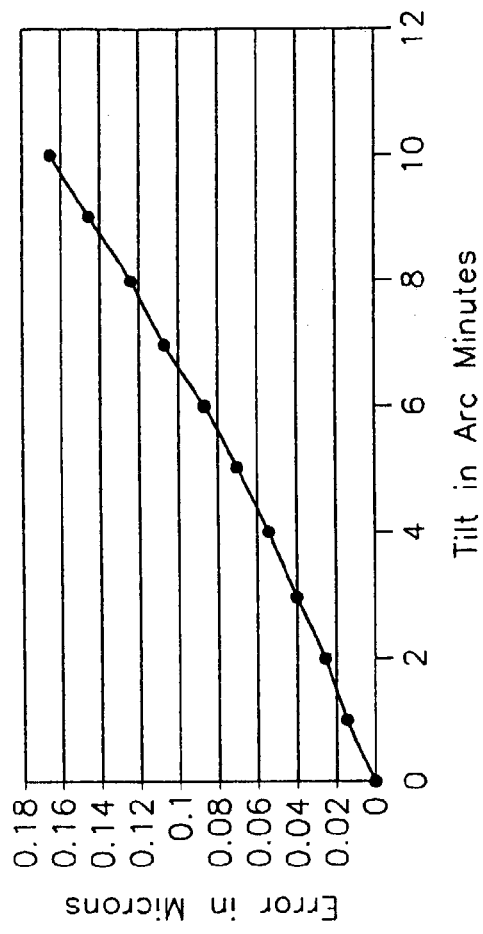
Figure 8A:
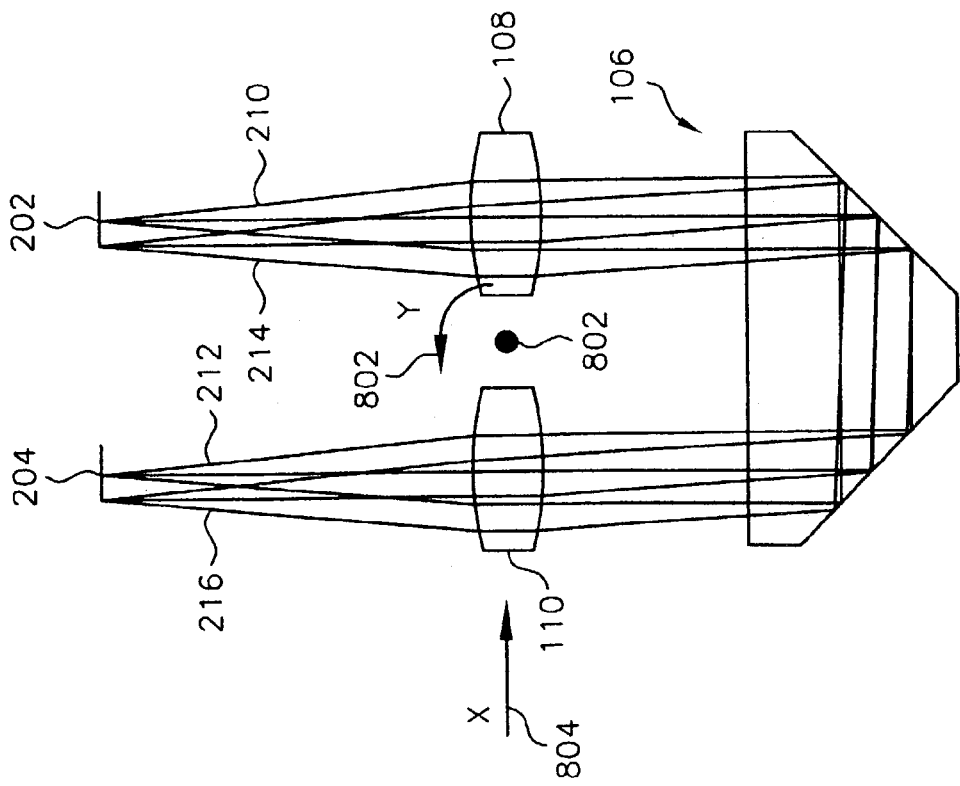

FIGS. 8A–8C illustrate the effect of tilt about the X and Y axis of the exemplary vision system. FIG. 8A is an additional side view of exemplary image ray traces 210, 212, 214, 216. In FIG. 8A, arrow 804 and dot 802 are used to depict the X and Y axes, respectively.

FIGS. 8B–8C are graphs of the effect of tilt around the X and Y axes in terms of tilt in arc minutes vs. error in microns. FIG. 8B shows the effect of tilt around the X axis versus error and image location along the Y axis. FIG. 8C shows the effect of tilt around the Y axis versus error and image location along the X axis.

Figure 9:
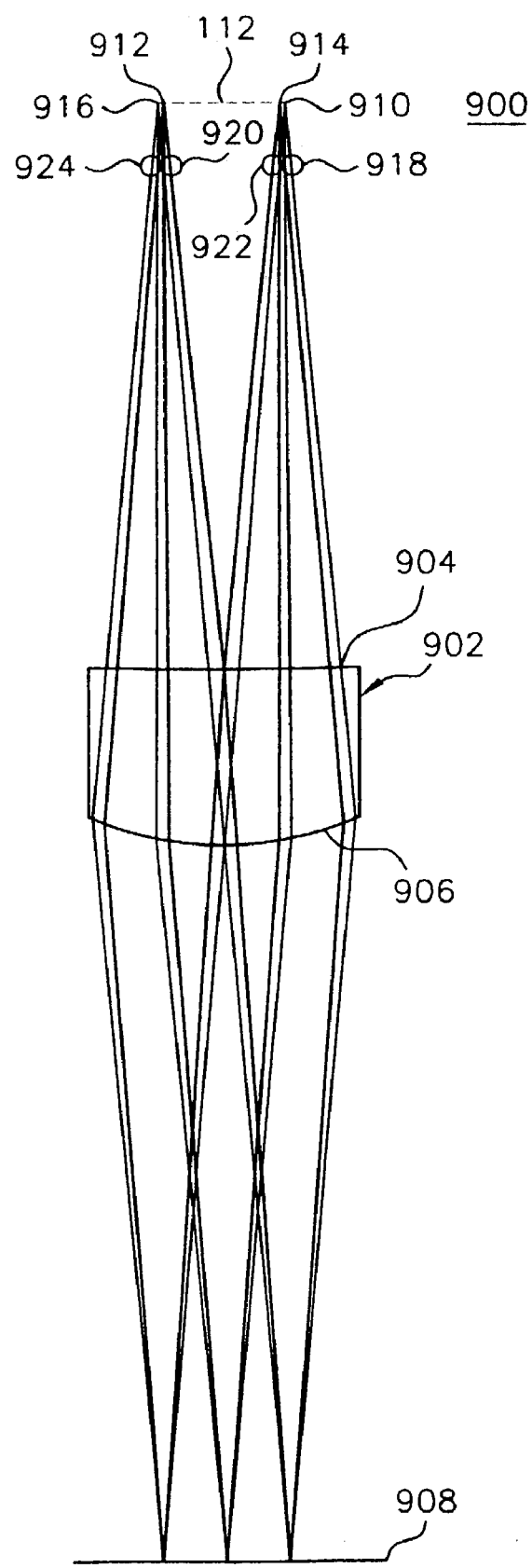
FIG. 9 is a side view of image ray traces according to a third exemplary embodiment of the present invention.

FIG. 9 is a detailed side view of image ray traces according to a third exemplary embodiment of the present invention. In FIG. 9, the reference position of bonding tool 104 is shown as a reflected ray which travels from first position 914 (on image plane 112) along first optical axis 114 (shown in FIG. 1), as direct image ray bundle 922 from first position 914 through lens element 902. Note that in this exemplary embodiment, lens element 902 has a relatively planar, upper surface 904 and a convex lower surface 906. Direct image ray bundle 922 continues along first optical axis 114 where it then passes through upper surface 904 of lens element 902, and in turn through convex surface 906. Direct image ray bundle 922 is then reflected onto total reflective surface 908. In a preferred embodiment, total reflective surface 908 is a mirror. Next, direct image ray bundle 922 travels back through lens element 902 as reflected image ray bundle 920 along second optical axis 116 (shown in FIG. 1) and onto image plane 112. It is reflected image ray bundle 920 that is detected by imaging unit 102 (shown in FIG. 1) as image 912. Similarly, positional displacement of bonding tool 104 is also shown in FIG. 9 and is illustrated by the path of direct image ray bundles 918, 924 from second position 910 to second viewed position 916.

FIGS. 10A–10E illustrate a further embodiment of the present invention. In this exemplary embodiment, a cornercube alignment tool is used to improve the accuracy of alignment of fibers, such as optical fibers 1008 and 1009. As in the previous exemplary embodiment, the use of a corner cube offset tool allows for the use of a single optical detector instead of the conventional multiple detector systems.

Figures 10A, 10B:
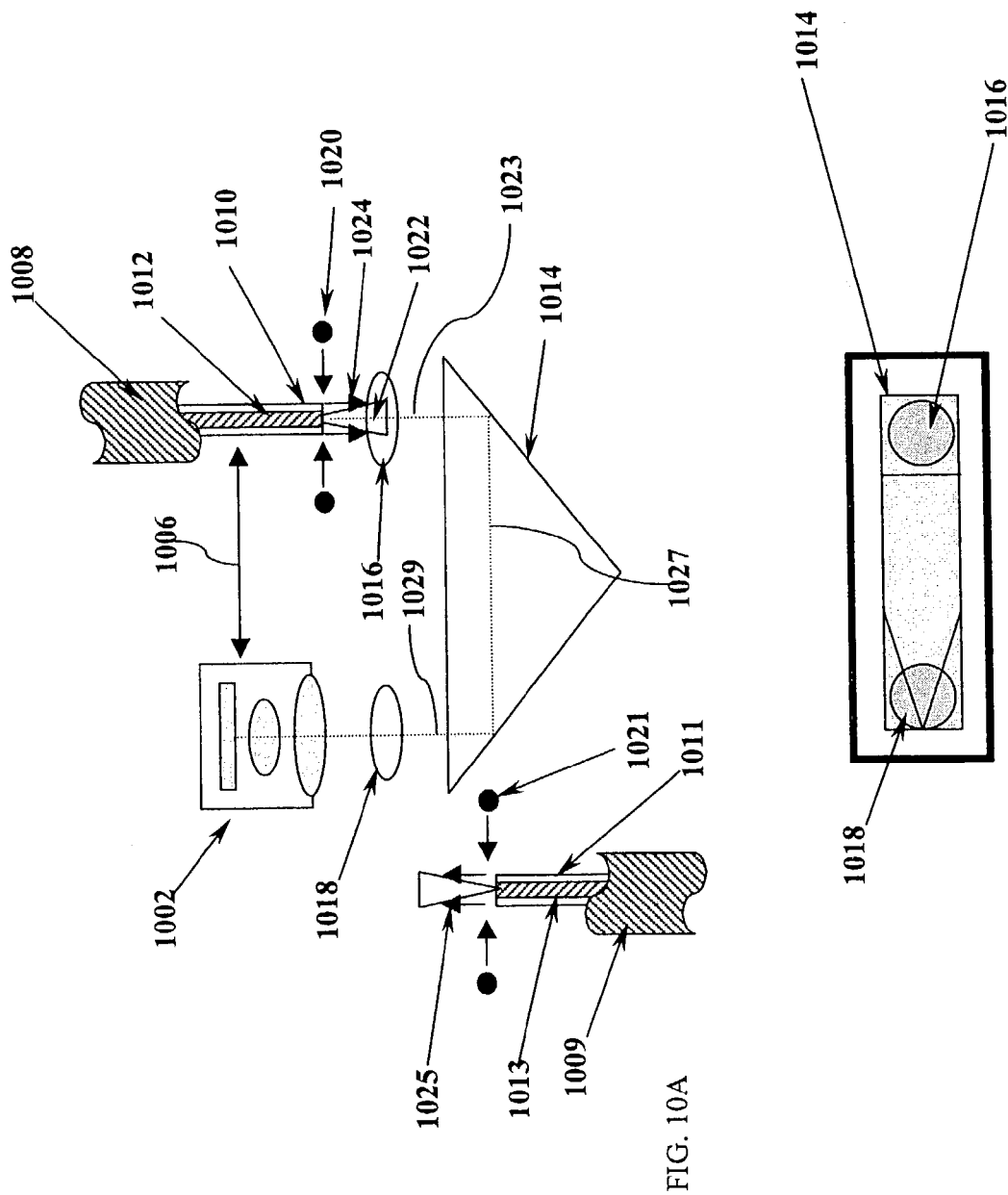
FIGS. 10A–10E are various views of a fourth exemplary embodiment of the present invention.

Referring to FIG. 10A, the exemplary embodiment includes cornercube 1014, lenses 1016, 1018, dark field illumination systems 1020, 1021 (which are well known to those practicing the art) to illuminate the fiber cladding edge 1010, 1011 of fiber cores 1012, 1013, respectively (which in turn produces reflections 1024, 1025 to outline cladding edges 1010, 1011), and optical detector 1002. In this exemplary embodiment, downward facing fiber 1008 is viewed by downward looking optical detector 1002, such as a camera (i.e., a substrate camera). Downward looking optical detector 1002 detects the emission of light 1022 from fiber core 1012 and is then be able to determine the proper offset 1027 between the optical fiber centerline 1023 and central ray 1029 of downward looking optical detector 1002. As is further shown in FIG. 10A, downward facing fiber 1008 and optical detector 1002 are offset from one another by predetermined distance 1006.

FIG. 10B is a plan view of the exemplary embodiment illustrated in FIG. 10A illustrating the relative positions of lenses 1016 and 1018, and cornercube 1014.

Figure 10C:
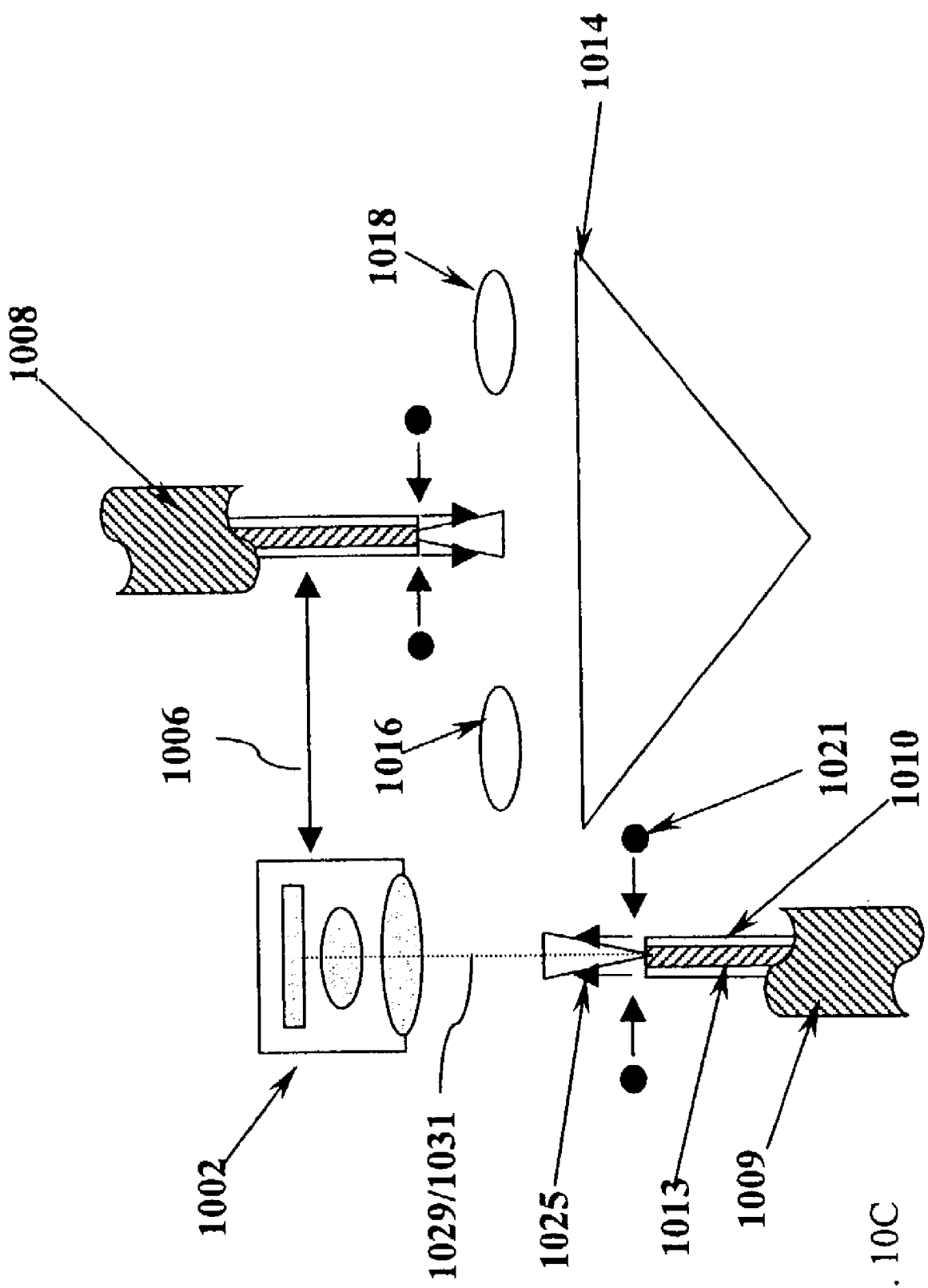

In FIG. 10C, downward looking optical detector 1002 and downward facing fiber 1008 are then repositioned such that central ray 1029 of downward looking optical detector 1002 is aligned with fiber centerline 1031 of upward facing fiber 1009. Once again dark field illumination system 1021 is used to illuminate upward facing fiber 1009 for recognition by the vision system to ensure proper alignment with optical detector 1002.

Figure 10D:
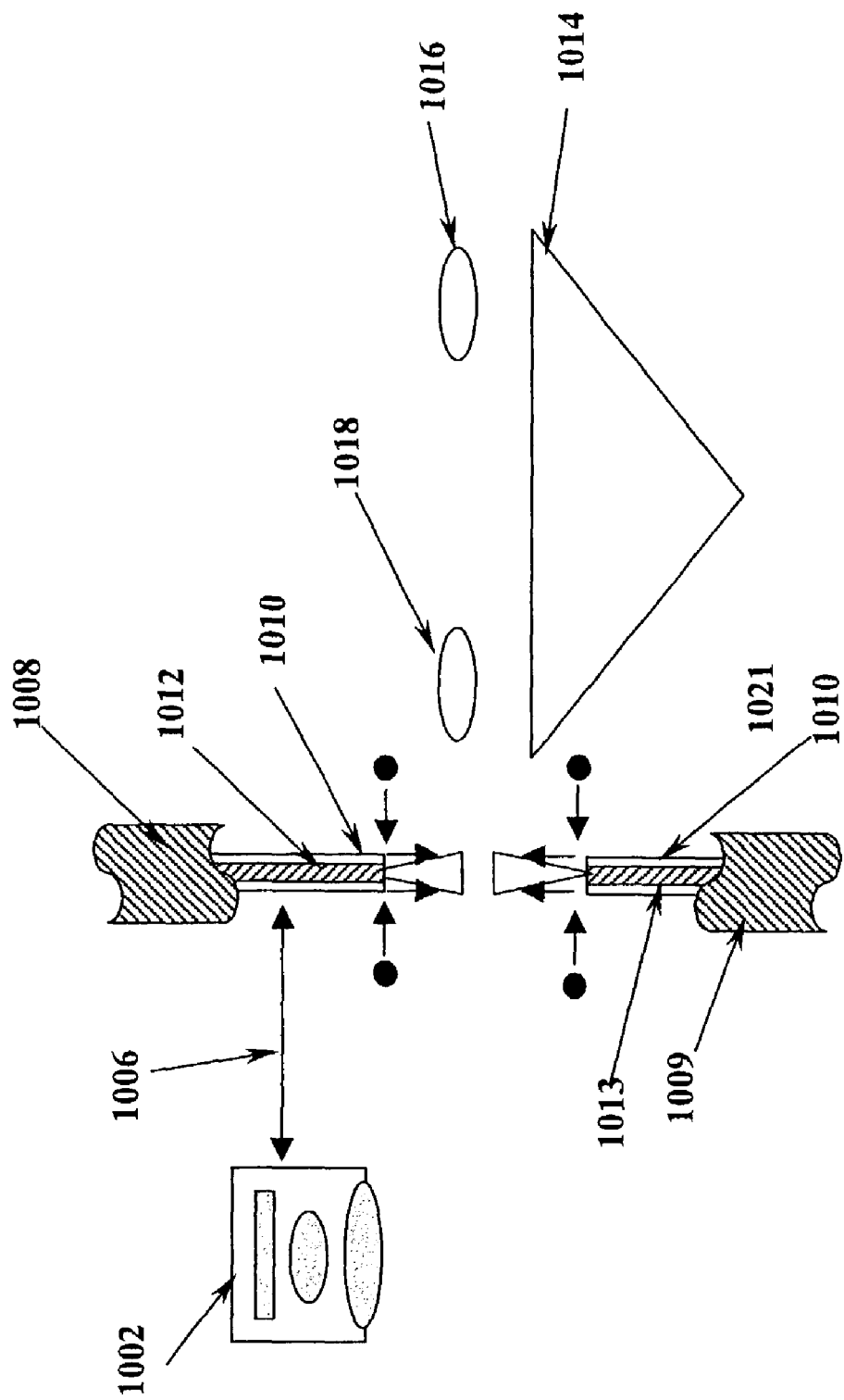

Next, and as shown in FIG. 10D, optical detector 1002 and downward facing fiber 1008 are again repositioned based on the offset 1027 determined during the process discussed above with respect to FIG. 10A. As a result downward facing fiber 1008 and upward facing fiber 1009 are aligned with one another.

Figure 10E:
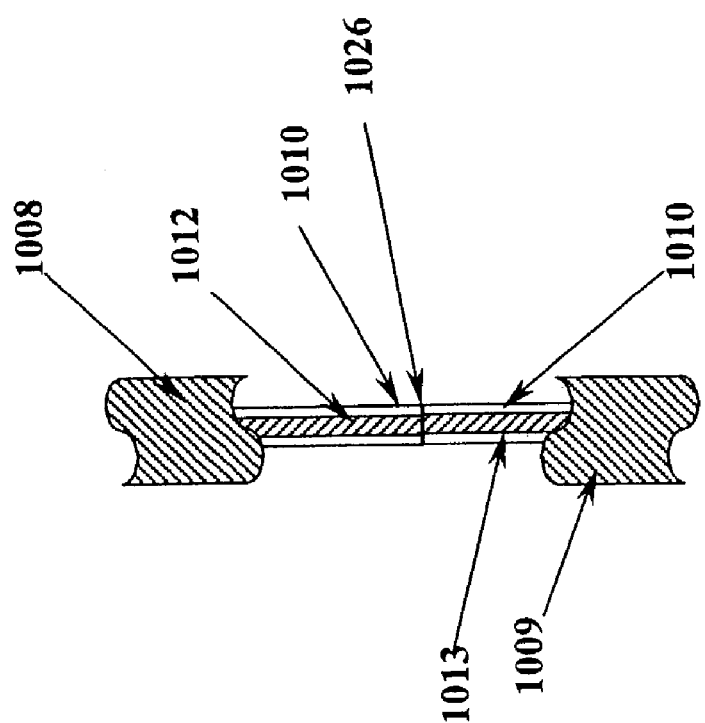
Figure 11:
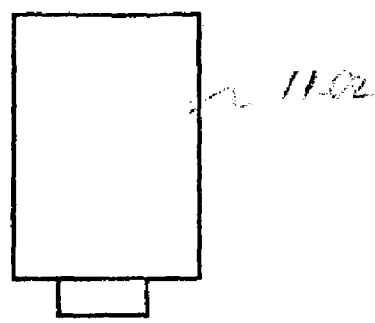
FIG. 11 is a vision system according to the prior art.
Figure 11:
Figure 11:
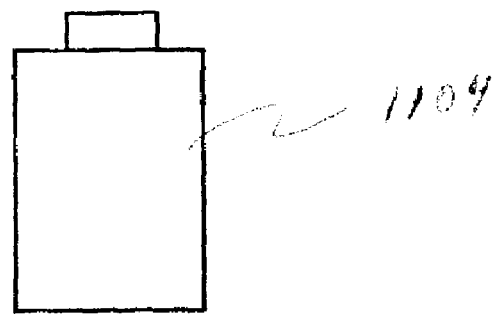

As shown in FIG. 10E, optical fibers 1008 and 1009 are then joined using conventional techniques, such as fusing the fibers together using radiation (not shown), or mechanical means, for example.

Figure 12:
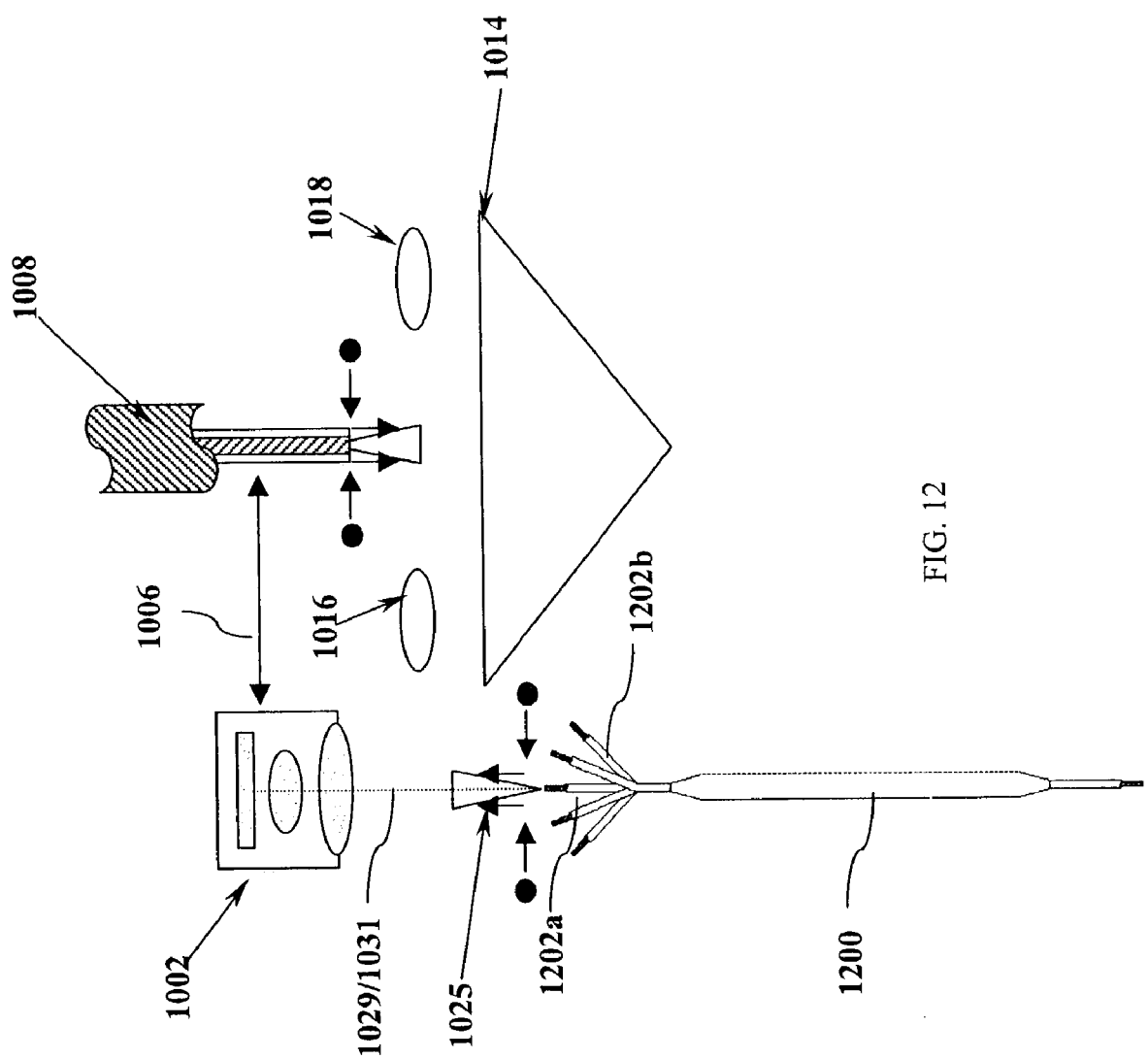
FIG. 12 is an illustration of a fifth exemplary embodiment of the present invention.

FIG. 12 illustrates yet a further embodiment of the present invention. In this exemplary embodiment, a cornercube alignment tool is used to align individual fibers (sub-fibers) 1202*a* of a fiber optic splitter 1200 with respective individual optical fibers 1008, etc. As in the previous exemplary embodiment, the use of a corner cube offset tool allows for the use of a single optical detector instead of the conventional multiple detector systems. As the steps leading up to alignment and coupling of optical fiber 1008 and sub-fiber 1202 are similar to the above exemplary embodiment, they are not repeated here.

Once the first sub-fiber is aligned with single fiber 1008, the process is repeated for a further sub-fiber, such as 1202*b*, and another single fiber (not shown).

Of course the exemplary embodiment is not limited to the fiber optic bundle of a fiber optic splitter being below optical detector 1002. The embodiment also contemplates that the relative positions of fiber optic bundle 1200 and optical fiber 1008 are reversed, such that fiber optic bundle 1200 is positioned above cornercube 1014.

Figure 13A:
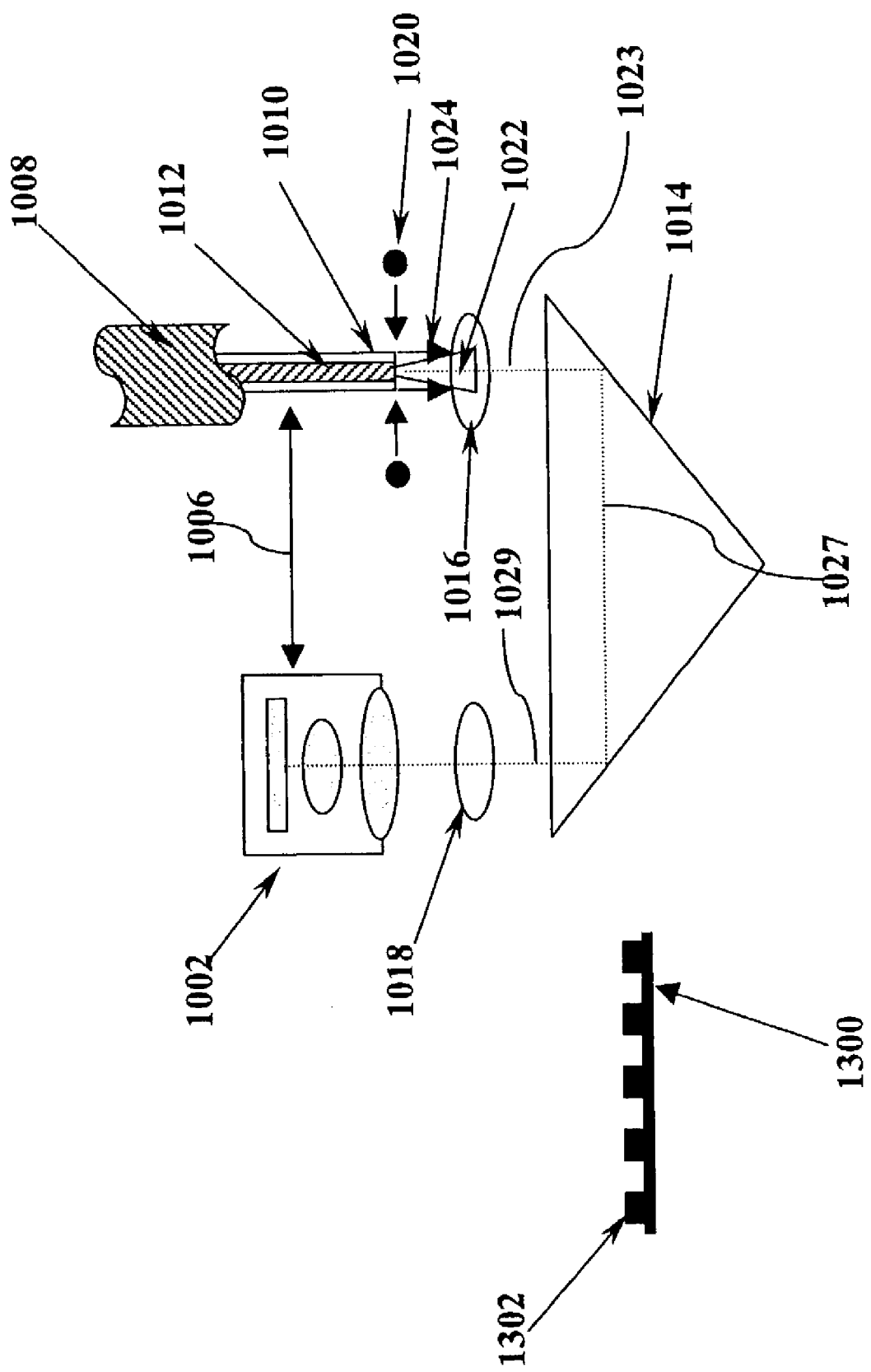
FIGS. 13A–13D are various views of a sixth exemplary embodiment of the present invention.

FIGS. 13A–13D illustrate a further embodiment of the present invention. In this exemplary embodiment, a cornercube alignment tool is used to improve the accuracy of alignment of an optical fiber 1008 with a circuit element, such as a detector 1302. In FIG. 13A, exemplary detector 1302 is part of an array 1300, although the invention is not so limited. It is also contemplated that circuit element 1302 may be a diode, such as a photodiode or an emitter of optical radiation. As in the previous exemplary embodiments, the use of a corner cube offset tool allows for the use of a single optical detector instead of the conventional multiple detector systems.

Referring to FIG. 13A, the exemplary embodiment includes cornercube 1014, lenses 1016, 1018, dark field illumination system 1020 (which is well known to those practicing the art) to illuminate the fiber cladding edge 1010 of fiber core 1012 (which in turn produces reflections 1024 to outline cladding edge 1010), and optical detector 1002. In this exemplary embodiment, downward facing fiber 1008 is viewed by downward looking optical detector 1002, such as a camera (i.e., a substrate camera). Downward looking optical detector 1002 detects the emission of light 1022 from fiber core 1012 and is then be able to determine the proper offset 1027 between the optical fiber centerline 1023 and central ray 1029 of downward looking optical detector 1002. As is further shown in FIG. 10A, downward facing fiber 1008 and optical detector 1002 are offset from one another by predetermined distance 1006.

Figure 13B:
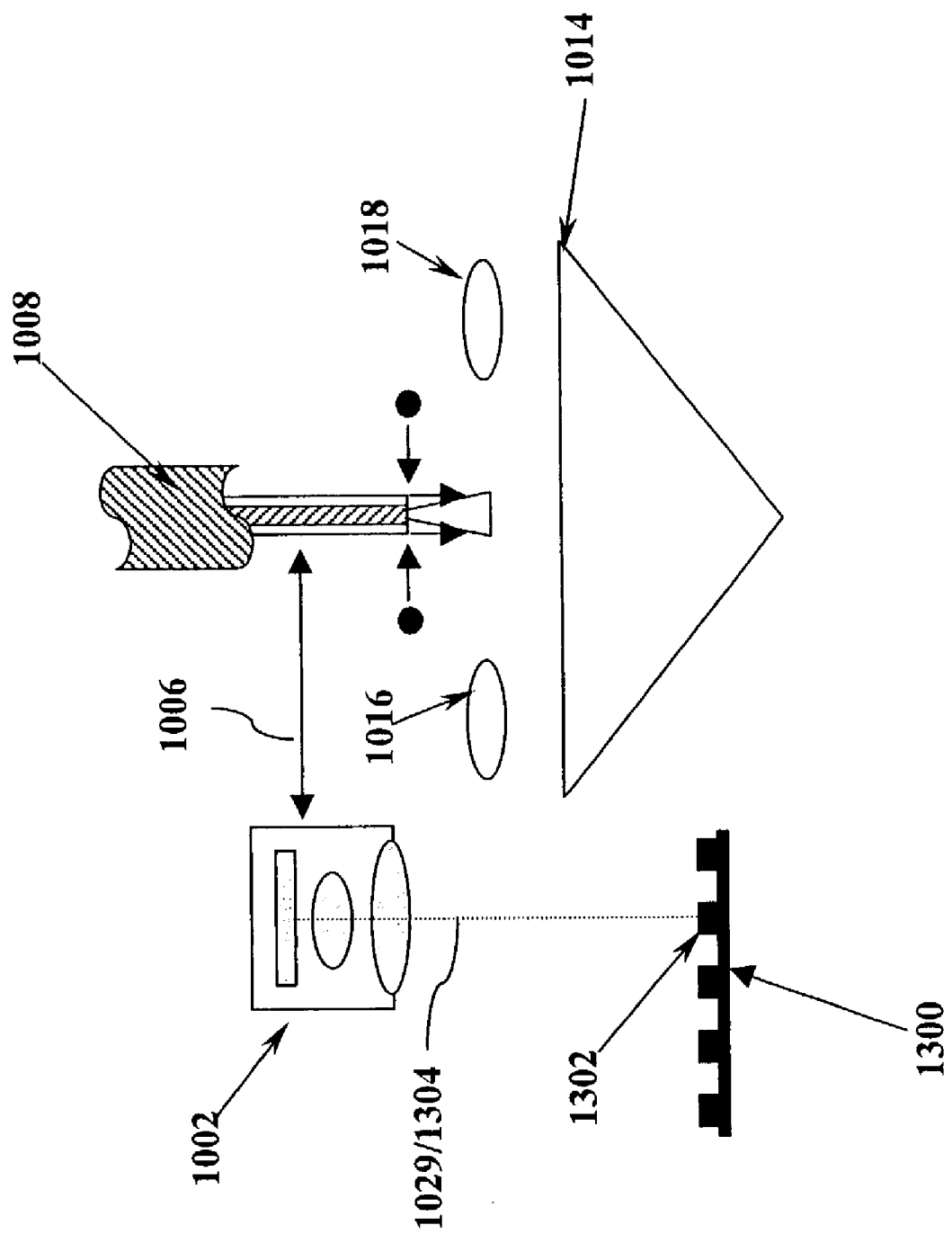

In FIG. 13B, downward looking optical detector 1002 and downward facing fiber 1008 are then repositioned such that central ray 1029 of downward looking optical detector 1002 is aligned with optical centerline 1304 of detector 1302. It is understood that optical centerline 1304, may not necessarily coincide with the physical center of detector 1302, but rather is dependant on the layout of the particular detector 1302. In this case the determination of optical centerline 1304 may be accomplished by the location of the center of the active sensing area of the detector.

Figure 13C:
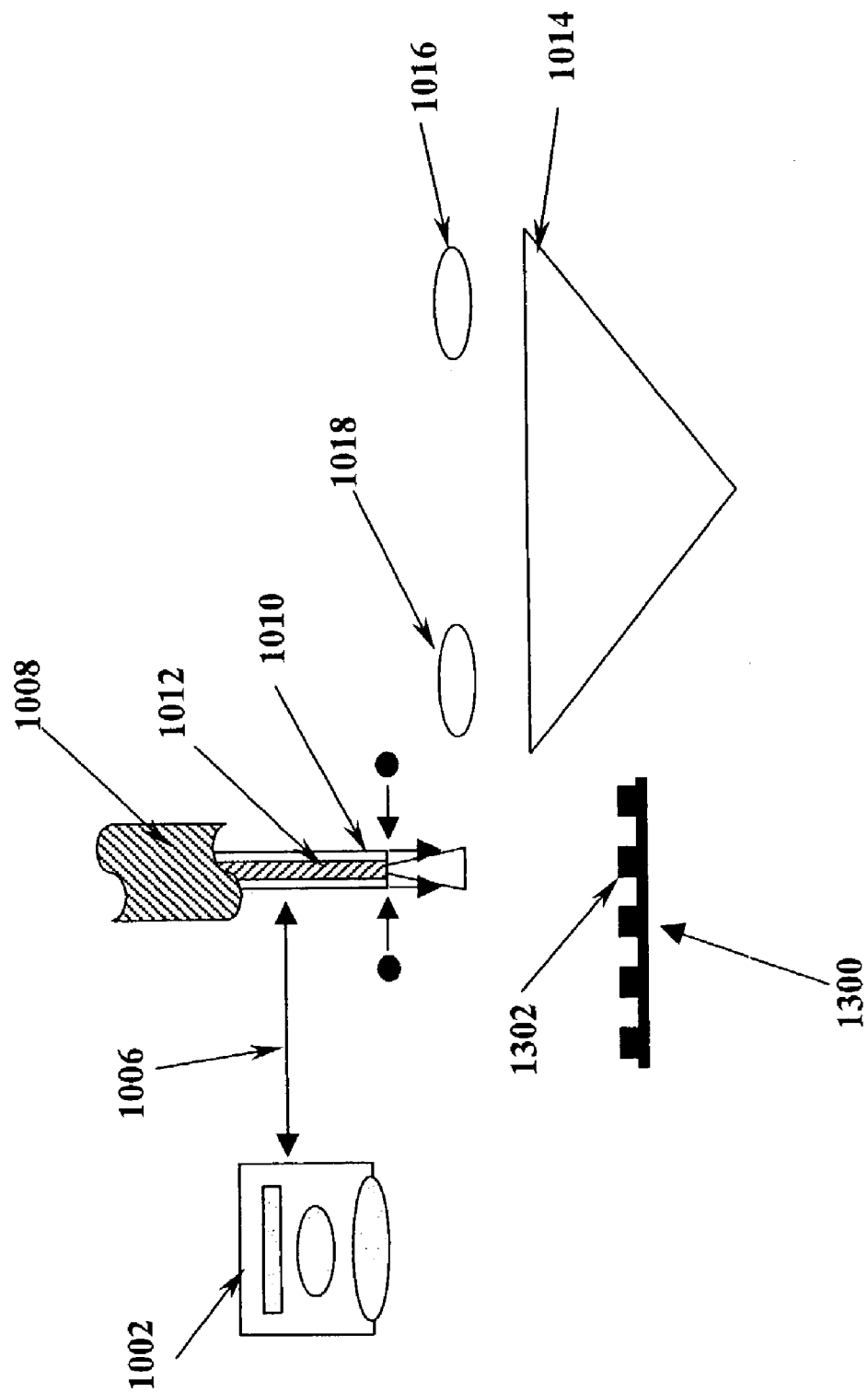
Figure 13D:
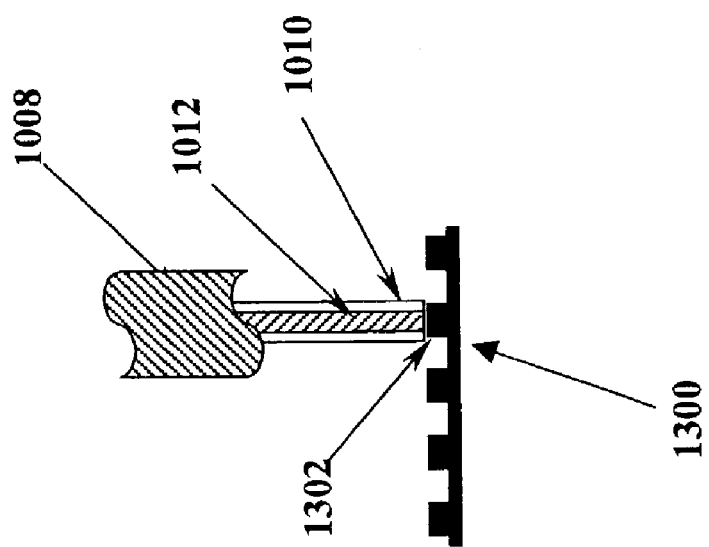

Next, and as shown in FIG. 13C, optical detector 1002 and downward facing fiber 1008 are again repositioned based on the offset 1027 determined during the process discussed above with respect to FIG. 13A. As a result downward facing fiber 1008 and detector 1302 are aligned with one another. As shown in FIG. 13D, optical fiber 1008 and detector 1302 are then kept in aligned position using conventional techniques, such as optical epoxies, UV epoxies, for example.

Although the invention has been described with reference to exemplary embodiments, it is not limited thereto. Rather, the appended claims should be construed to include other variants and embodiments of the invention, which may be made by those skilled in the art without departing from the true spirit and scope of the present invention.

What is claimed is:

1. A method for use with an optical imager to align a pair of optical fibers, the method comprising the steps of:
    providing a cornercube offset tool below an end of a first one of the pair of optical fibers, the cornercube offset tool having three internal reflection surfaces;
    viewing an indirect image of the end of the first one of the pair of optical fibers with the optical imager through the cornercube offset tool;
    determining an offset distance of the first one of the pair of optical fibers;
    viewing a direct image of an end of a second one of the pair of optical fibers with the optical imager; and
    aligning the first one of the pair of optical fibers with the second one of the pair of optical fibers.

2. A method for use with an optical imager to align optical fibers, the method comprising the steps of:
    a) selecting a first optical fiber from among a plurality of optical fibers from a fiber optic splitter bundle;
    b) providing a cornercube offset tool below an end of the first optical fiber;
    c) viewing an indirect image of the end of the first optical fiber with the optical imager through the cornercube offset tool;
    d) determining an offset distance of the first optical fiber;
    e) viewing a direct image of an end of a second optical fiber with the optical imager; and
    f) aligning the first optical fiber with the second optical fiber.

3. The method according to claim 2, further comprising the steps of:
    g) selecting a further optical fiber from the fiber optic splitter bundle;
    h) repeating steps b) through f) for the further optical fiber and a third optical fiber.

4. The method according to claim 2, further comprising the step of coupling the first optical fiber with the second optical fiber.

5. The method according to claim 2, further comprising the steps of:
    g) bringing the end of the first optical fiber into contact with the end of the second optical fiber;
    h) coupling the end of the first optical fiber with the end of the second optical fiber.

6. The method according to claim 2, further comprising the steps of:
    g) bringing the end of the first optical fiber into contact with the end of the second optical fiber;
    h) fusing the end of the first optical fiber with the end of the second optical fiber.

7. The method according to claim 6, wherein the fusing step h) is accomplished by irradiating respective ends of the optical fibers.

8. A method for use with an optical imager to align optical fibers, the method comprising the steps of:
    a) providing a cornercube offset tool below an end of a first optical fiber;
    b) viewing an indirect image of the end of the first optical fiber with an optical imager through the cornercube offset tool;
    c) determining an offset distance of the first optical fiber;
    d) selecting a second optical fiber from among a plurality of optical fibers from a fiber optic splitter bundle;
    e) viewing a direct image of an end of a second optical fiber with the optical imager; and
    f) aligning the first optical fiber with the second optical fiber.

9. The method according to claim 8, further comprising the steps of:
    g) providing a third optical fiber;
    h) selecting a further optical fiber from the fiber optic splitter bundle;
    i) repeating steps b) through f) for the third optical fiber and the further optical fiber.

10. The method according to claim 8, further comprising the step of coupling the first optical fiber with the second optical fiber.

11. The method according to claim 8, further comprising the steps of:
    g) bringing the end of the first optical fiber into contact with the end of the second optical fiber;
    h) coupling the end of the first optical fiber with the end of the second optical fiber.

12. The method according to claim 8, further comprising the steps of:
    g) bringing the end of the first optical fiber into contact with the end of the second optical fiber;
    h) fusing the end of the first optical fiber with the end of the second optical fiber.

13. The method according to claim 12, wherein the fusing step h) is accomplished by irradiating respective ends of the optical fibers.

14. A method for aligning an optical fiber and a circuit element, the method comprising the steps of:
    providing a cornercube offset tool below a vision plane of the pair of optical fiber;
    viewing an indirect image of the optical fiber with an optical detector through the cornercube offset tool;

determining an offset between the optical fiber and the optical detector based on the indirect image;

aligning the optical fibers with the circuit element based on the offset; and coupling the optical fiber to the circuit element.

15. A method for use with an optical imager to align an optical fiber and a circuit element, the method comprising the steps of:

providing a cornercube offset tool below an end of the optical fiber;

viewing an indirect image of the end of the optical fiber with the optical imager through the cornercube offset tool;

determining an offset distance of the optical fiber;

viewing a direct image of a surface of the circuit element with the optical imager; and aligning the optical fiber with the circuit element.

* * * * *